(12) United States Patent
Chonnad

(10) Patent No.: US 12,400,062 B2
(45) Date of Patent: Aug. 26, 2025

(54) SELECTION AND PLACEMENT OF SAFETY MECHANISMS

(71) Applicant: Synopsys, Inc., Mountain View, CA (US)

(72) Inventor: Shivakumar Shankar Chonnad, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 605 days.

(21) Appl. No.: 17/900,654

(22) Filed: Aug. 31, 2022

(65) Prior Publication Data
US 2024/0070367 A1    Feb. 29, 2024

(51) Int. Cl.
*G06F 30/392*    (2020.01)
(52) U.S. Cl.
CPC ................. *G06F 30/392* (2020.01)
(58) Field of Classification Search
CPC .. G06F 30/30; G06F 30/3461; G06F 30/3466; G06F 30/348; G06F 30/392; G06F 30/333; G06F 30/337; G06F 2111/04
USPC .......................................................... 716/100
See application file for complete search history.

(56) References Cited

U.S. PATENT DOCUMENTS 8,396,696 B1 *   3/2013   Ho ........................ G06F 30/392
                                                                716/100

* cited by examiner

*Primary Examiner* — Paul Dinh
(74) *Attorney, Agent, or Firm* — Patterson + Sheridan, LLP

(57) ABSTRACT

A method of designing a circuit includes identifying a first path from a first selected node of a circuit design. A first attribute is assigned to the first selected node. The method also includes identifying a second path from a second selected node of the circuit design. A second attribute is assigned to the second selected node. The method further includes determining a first intersection of the first path and the second path, selecting, by a processing device, a safety mechanism from a plurality of safety mechanisms based at least in part on the first attribute and the second attribute, and adding the safety mechanism to the circuit design at the first intersection.

20 Claims, 8 Drawing Sheets

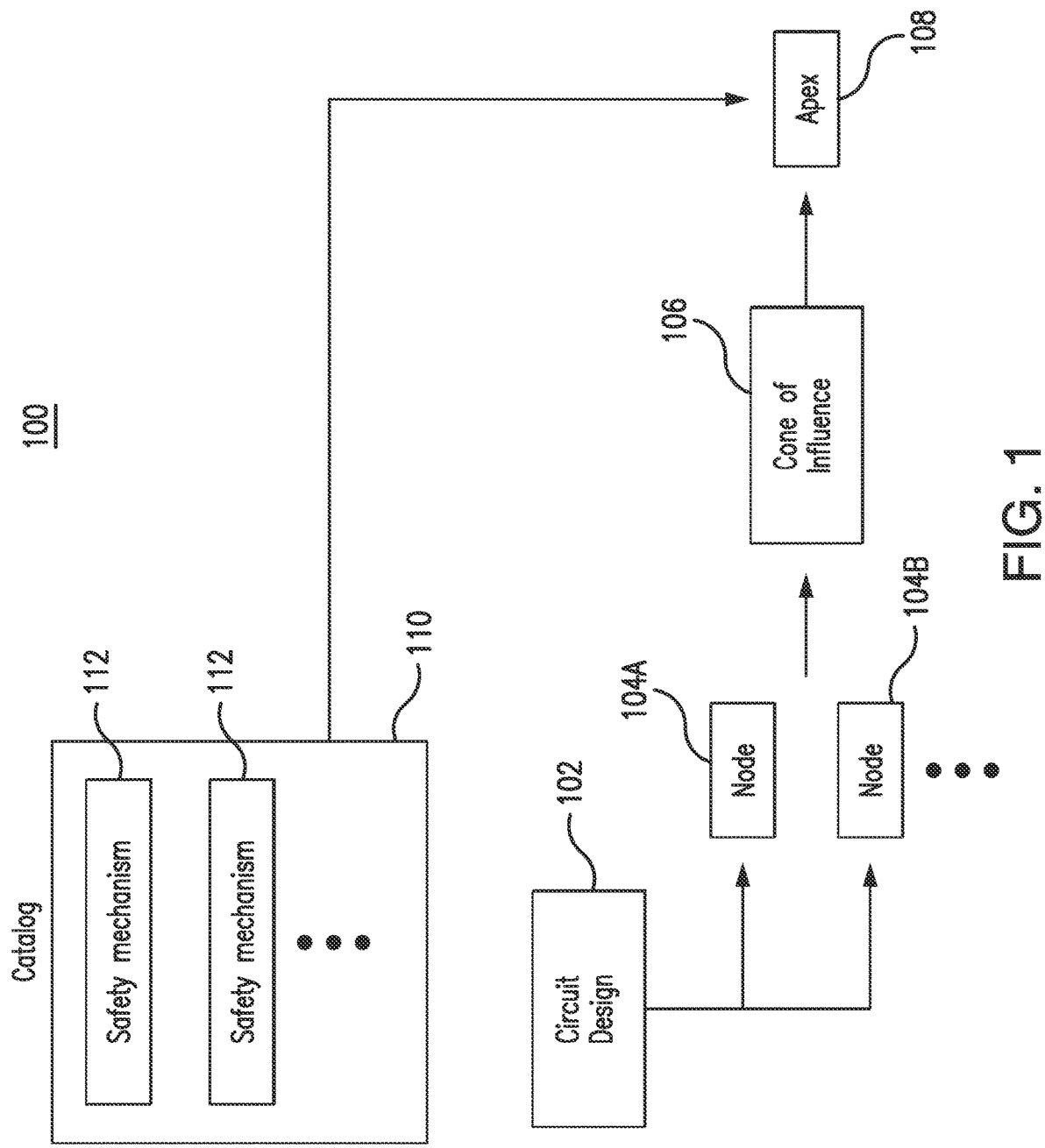

110

112A

| ID | SM1 |
|---|---|
| Name | ECC Encoder |
| Attribute1 | Non-clock, Enc Datapath, High DC |
| Attribute2 | DC=99% |

112B

| ID | SM2 |
|---|---|
| Name | ECC Decoder |
| Attribute1 | Non-clock, Dec Datapath, High DC |
| Attribute2 | DC=99% |

112C

| ID | SM3 |
|---|---|
| Name | Parity Encoder |
| Attribute1 | Non-clock, Enc Datapath, Med DC |
| Attribute2 | DC=87% |

112D

| ID | SM4 |
|---|---|
| Name | Parity Decoder |
| Attribute1 | Non-clock, Dec Datapath, Med DC |
| Attribute2 | DC=87% |

112E

| ID | SM5 |
|---|---|
| Name | Watchdog Timer |
| Attribute1 | Temporal-time-based |
| Attribute2 | DC=90% |

112F

| ID | SM6 |
|---|---|
| Name | Watchdog Timer |
| Attribute1 | Temporal-handshake-based |
| Attribute2 | DC=90% |

FIG. 2

SELECTION AND PLACEMENT OF SAFETY MECHANISMS

TECHNICAL FIELD

The present disclosure relates to an electronic design automation (EDA) system and more particularly, to the selection and placement of safety mechanisms in electronic circuit designs.

BACKGROUND

Integrated circuit (IC) chips may need to meet certain safety and quality standards. For example, chips used in automobiles may be subject to certain safety rules and standards to prevent catastrophic automobile accidents. These chips may include safety mechanisms that detect faults or errors in certain parts of the electronic circuit.

SUMMARY

The present disclosure describes systems and methods for selecting and placing safety mechanisms into circuit designs. According to an embodiment, a method of designing a circuit includes identifying a first path from a first selected node of a circuit design. A first attribute is assigned to the first selected node. The method also includes identifying a second path from a second selected node of the circuit design. A second attribute is assigned to the second selected node. The method further includes determining a first intersection of the first path and the second path, selecting, by a processing device, a safety mechanism from a plurality of safety mechanisms based at least in part on the first attribute and the second attribute, and adding the safety mechanism to the circuit design at the first intersection.

A third attribute may assigned to the safety mechanism, and selecting the safety mechanism may be based at least in part on the third attribute matching at least one of the first attribute and the second attribute. The third attribute may include a diagnostic coverage percentage of the safety mechanism. The third attribute may include an indication of whether the safety mechanism is used on an encoder datapath or a decoder datapath.

The method may include determining a second intersection of the first path and the second path. Adding the safety mechanism at the first intersection may be based at least in part on a comparison of one or more of an area and a timing of the circuit design to the first intersection to one or more of an area and a timing of the circuit design to the second intersection.

The first selected node may be a pin, a wire, a flop, or a signal in the circuit design.

Identifying the first path and the second path may produce a cone of influence, and the first intersection may be an apex of the cone of influence.

According to another embodiment, a system for designing a circuit includes a memory and a processor communicatively coupled to the memory. The processor traces a first path from a first selected node of a circuit design. A first attribute is assigned to the first selected node. The processor traces a second path from a second selected node of the circuit design. A second attribute is assigned to the second selected node. The processor determines a first intersection of the first path and the second path, selects a safety mechanism from a catalog of safety mechanisms based at least in part on the first attribute and the second attribute, and adds the safety mechanism to the circuit design at the first intersection.

A third attribute may assigned to the safety mechanism in the catalog, and selecting the safety mechanism may be based at least in part on the third attribute matching at least one of the first attribute and the second attribute. The third attribute may include a diagnostic coverage percentage of the safety mechanism. The third attribute may include an indication of whether the safety mechanism is used on an encoder datapath or a decoder datapath.

The processor may determine a second intersection of the first path and the second path. Adding the safety mechanism at the first intersection may be based at least in part on a comparison of one or more of an area and a timing of the circuit design to the first intersection to one or more of an area and a timing of the circuit design to the second intersection.

The first selected node may be a pin, a wire, a flop, or a signal in the circuit design.

Tracing the first path and the second path may produce a cone of influence, and the first intersection may be an apex of the cone of influence.

According to another embodiment, a non-transitory, computer readable medium stores instructions that, when executed by a processor, cause the processor to perform an operation for designing a circuit. The operation includes tracing a first path from a first node of a circuit design and a second path from a second node of the circuit design to produce a cone of influence. A first attribute is assigned to the first node, and a second attribute is assigned to the second node. The operation also includes determining a first apex of the cone of influence, selecting a safety mechanism from a catalog of safety mechanisms based at least in part on the first attribute and the second attribute, and adding the safety mechanism to the circuit design at the first apex of the cone of influence.

A third attribute may be assigned to the safety mechanism in the catalog, and selecting the safety mechanism may be based at least in part on the third attribute matching at least one of the first attribute and the second attribute. The third attribute may include a diagnostic coverage percentage of the safety mechanism. The third attribute may include an indication of whether the safety mechanism is used on an encoder datapath or a decoder datapath.

The operation may include determining a second apex of the cone of influence. Adding the safety mechanism at the first apex may be based at least in part on a comparison of one or more of an area and a timing of the circuit design to the first apex to one or more of an area and a timing of the circuit design to the second apex.

The first node may be a pin, a wire, a flop, or a signal in the circuit design.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1 illustrates an example system for selecting and placing safety mechanisms into a circuit design.

FIG. 2 illustrates an example catalog of safety mechanisms in the system of FIG. 1.

DETAILED DESCRIPTION

Figure 3:
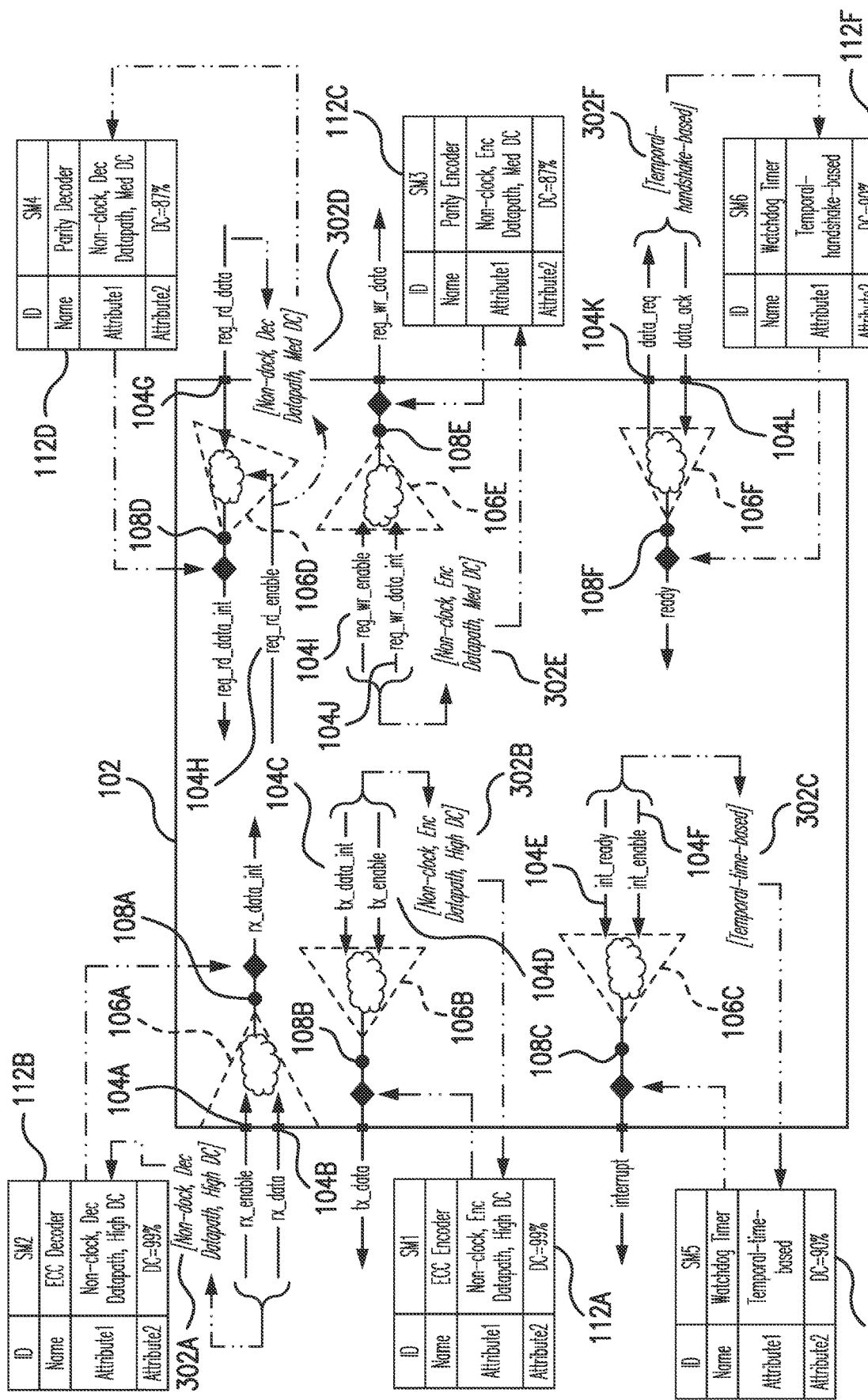
FIG. 3 illustrates how safety mechanisms are selected placed into an example circuit design in the system of FIG. 1.

Aspects of the present disclosure relate to the automatic selection and placement of safety mechanisms. Certain integrated circuit (IC) chips include safety mechanisms that detect functional safety related faults or errors during the operation of the electronic circuit in the chip. For example, IC chips used in automobiles may include safety mechanisms that detect functional safety related faults or errors before these faults or errors lead to catastrophic automobile crashes. In existing electronic circuit design systems, these safety mechanisms are added to an electronic circuit design manually by a circuit designer. The circuit designer selects the safety mechanisms to add to the circuit design and the locations in the circuit design where the safety mechanisms are added. This process requires human judgment and subjectivity, which may result in incorrect safety mechanisms being selected or suboptimal placement of safety mechanisms.

The present disclosure describes a system that automatically determines the safety mechanisms to add to a circuit design and the locations where the safety mechanisms are added. A circuit designer selects nodes in the circuit design and the system traces paths from the selected nodes to produce a cone of influence. The circuit design then determines an intersection of the traced paths originating from the nodes, which may be an apex of the cone of influence. The circuit designer may also have specified certain attributes for these selected nodes. The system references a catalog of safety mechanisms, which includes attributes for the safety mechanisms. The system selects a safety mechanism with attributes that match or are similar to the attributes of the selected nodes. The system then adds the selected safety mechanism to the intersection of the traced paths. In this manner, the system automatically selects and places the safety mechanism.

In certain embodiments, the system provides several technical advantages. For example, the system may select correct safety mechanisms to use for different groups of nodes. Additionally, the system may optimally place the safety mechanisms in the circuit design to catch errors or fault. As a result, the system may produce circuit designs that are safer during operation (e.g., in an automobile).

FIG. 1 illustrates an example system 100 for selecting and placing safety mechanisms into a circuit design. Generally, the system 100 may be an electronic circuit design system implemented by a computer system (e.g., the computer system 800 shown in FIG. 8). In particular embodiments, the system 100 automatically selects and places safety mechanisms into a circuit design, which improves the safety of the circuit during operation.

The system 100 may receive or create a circuit design 102. Generally, a circuit designer may use the system 100 to create or load the circuit design 102. The circuit design 102 may indicate various circuit components and the connections between the circuit components. These circuit components or connections may be represented by nodes 104 in the circuit design 102. As seen in FIG. 1, the circuit design 102 includes nodes 104A and 104B. The circuit design 102 may include any suitable number of nodes 104. The nodes 104 may represent any portion of the circuit design 102. For example, the nodes 104 may represent pens, wires, flops, or signals in the circuit design 102.

The circuit designer may assign attributes to the nodes 104. These attributes may indicate the types of circuit components or connections included within the nodes 104. As a result, the attributes may indicate the types of errors or faults that may be relevant to the nodes 104. For example, certain attributes may indicate whether a node 104 is part of an encoder path or a decoder path. As another example, some attributes may indicate whether a node 104 is part of a time-based circuit or a handshake-based circuit. In some embodiments, safety mechanisms are selected for a node 104 or a set of nodes 104 based on the attributes that are assigned the node 104 or the set of nodes 104.

The system 100 may identify or trace paths within the circuit design 102 to determine a cone of influence 106. Generally, a circuit designer may select or specify various nodes 104 in the circuit design 102 from which the system 100 traces paths. When tracing a path from a selected node 104, the system 100 determines the flow of an electric signal through the circuit design 102 starting from the selected node 104. For each selected node 104, the system 100 traces one or more paths from the selected node 104. For example, if a signal branches as it flows from the selected node 104, the system 100 may trace a path for each of the branches of the flow. The system 100 may then determine where in the circuit design 102 the various traced paths intersect. These points of intersection may be the endpoints of a cone of influence 106. Each cone of influence 106 indicates the portions of the circuit design 102 that are covered by the traced paths that meet at the intersection. The system 100 may determine any suitable number of cones of influence 106 for each set of selected nodes 104.

The system 100 determines an apex 108 for each determined cone of influence 106. The apex 108 for each cone of influence 106 may be the point of intersection of the traced paths that form the cone of influence 106. In certain embodiments, the system 100 may place one or more safety mechanisms at the apex 108 of a cone of influence 106. In some embodiments, if the traced paths that form a cone of influence 106 intersect at multiple points, then the cone of influence 106 is considered to have multiple apexes 108 and a subsequent evaluation using constraints (e.g., area or timing constraints) is performed to determine which apex 108 should be selected for placement of the safety mechanism.

The system 100 may select one or more safety mechanisms 112 from a catalog 110 of safety mechanisms 112 to place at the apex 108. As seen in FIG. 1, the catalog 110 includes any suitable number of safety mechanisms 112. Generally, each safety mechanism 112 in the catalog 110 is assigned one or more attributes that describe the safety mechanism 112. For example, a circuit designer may assign attributes that indicate the types of faults or errors that the safety mechanisms 112 detect. The system 100 may select one or more safety mechanisms 112 to place at an apex 108 based on the attributes assigned to the safety mechanisms 112. For example, the circuit designer may have assigned certain attributes to the selected nodes 104 from which the cone of influence 106 was formed. The system 100 may compare the attributes assigned to the nodes 104 with the attributes assigned to the safety mechanisms 112 in the catalog 110. The system 100 may select the safety mechanisms 112 that have attributes that match the attributes assigned to the nodes 104. The system 100 then places the selected safety mechanisms 112 at the apex 108 of the cone of influence 106. In this manner, the system 100 ensures that the correct safety mechanism 112 was selected for the selected nodes 104 and that the safety mechanism 112 was placed in an optimal position in the circuit design 102, in certain embodiments.

FIG. 2 illustrates an example catalog 110 of safety mechanisms in the system 100 of FIG. 1. As discussed previously, the catalog 110 includes any suitable number of safety mechanisms 112. As seen in FIG. 2, the catalog 110 includes the safety mechanisms 112A, 112B, 112C, 112D, 112E, and 112F. Generally, each entry in the catalog 110 includes identifiers for a safety mechanism 112 along with attributes that describe the safety mechanism 112. For example, the attributes may describe the type of fault or error detected by the safety mechanism 112. As another example, the attributes may describe a diagnostic coverage percentage of the safety mechanism 112. The diagnostic coverage percentage may indicate a percentage of a particular type of faults or errors that the safety mechanism 112 checks or attempts to detect. A high diagnostic coverage percentage may indicate that the safety mechanism 112 checks for a larger number of faults or errors of a particular type.

In the example of FIG. 2, the catalog 110 includes the safety mechanisms 112A, 112B, 112C, 112D, 112E, and 112F. The safety mechanism 112A is identified by an identifier SM1 and detects faults or errors in an error correction code (ECC) encoder. The entry in the catalog 110 also indicates that the safety mechanism 112A, identified by an identifier SM1, is a non-clock type safety mechanism that checks for faults or errors in an encoder data path (Attribute1). The entry also indicates that the safety mechanism 112A provides high diagnostic coverage (Attribute1). Specifically, the entry indicates that the diagnostic coverage of the safety mechanism 112A is 99% (Attribute2).

The entry for the safety mechanism 112B indicates that the safety mechanism 112B is identified by an identifier SM2 and checks for faults or errors in an ECC decoder. The entry also indicates that the safety mechanism 112B is a non-clock type safety mechanism that checks for faults or errors in a decoder data path (Attribute1). The entry further indicates that the safety mechanism 112B provides high diagnostic coverage (Attribute1). Specifically, the safety mechanism 112B provides a diagnostic coverage of 99% (Attribute2).

The entry for the safety mechanism 112C indicates that the safety mechanism 112C is identified by an identifier SM3 and checks for faults or errors in a parody encoder. The entry also indicates that the safety mechanism 112C is a non-clock safety type mechanism that checks for faults or errors in an encoder datapath (Attribute1). The entry further indicates that the safety mechanism 112C provides a medium level of diagnostic coverage (Attribute1). Specifically, the safety mechanism 112C provides a diagnostic coverage of 87% (Attribute2).

The entry for the safety mechanism 112D indicates that the safety mechanism 112D is identified by an identifier SM4 and checks for faults or errors in a parody decoder. The entry also indicates that the safety mechanism 112D is a non-clock type safety mechanism that checks for faults or errors in a decoder datapath (Attribute1). The entry further indicates that the safety mechanism 112D provides a medium level of diagnostic coverage (Attribute1). Specifically, the safety mechanism 112D provides a diagnostic coverage of 87% (Attribute2).

The entry for the safety mechanism 112E indicates that the safety mechanism 112E is identified by an identifier SM5 and checks for faults or errors as a watchdog timer. The entry also indicates that the safety mechanism 112E is a temporal time-based type safety mechanism (Attribute1). The entry further indicates that the safety mechanism 112E provides a diagnostic coverage of 90% (Attribute2).

The entry for the safety mechanism 112F indicates that the safety mechanism 112F is identified by an identifier SM6 and checks for faults or errors as a watchdog timer. The entry also indicates that the safety mechanism 112F is a temporal handshake-based type safety mechanism (Attribute1). The entry further indicates that the safety mechanism 112F provides a diagnostic coverage of 90% (Attribute2).

When the system 100 selects a safety mechanism 112 from the catalog 110, the system 100 may select a safety mechanism 112 with attributes that match the attributes of the selected nodes 104 from which the cone of influence 106 was formed. For example, if the selected nodes 104 have attributes that indicate that the selected nodes 104 are on a decoder datapath and need high diagnostic coverage, then the system 100 may select the safety mechanism 112B for the selected nodes 104. As another example, if the selected nodes 104 have attributes that indicate the selected nodes 104 are on an encoder datapath and require a medium level of diagnostic coverage, then the system 100 may select the safety mechanism 112C for the selected nodes 104. In this manner, the system 100 selects the safety mechanism 112 from the catalog 110 that is most suitable for the selected nodes 104, in particular embodiments.

FIG. 3 illustrates how safety mechanisms are selected placed into an example circuit design 102 in the system 100 of FIG. 1. Generally, FIG. 3 shows the selection and placement of particular safety mechanisms 112 into the circuit design 102. As seen in FIG. 3, certain nodes 104 of the circuit design 102 have been selected and cones of influence 106 have been formed from those selected nodes 104. Specifically, a circuit designer has selected the nodes 104A, 104B, 104C, 104D, 104E, 104F, 104G, 104H, 104I, 104J, 104K, and 104L. The cones of influence 106A, 106B, 106C, 106D, 106E, and 106F have been formed from the selected nodes 104.

The circuit designer may have instructed the system 100 to identify paths starting from the nodes 104A and 104B, and in response, the system 100 may trace paths starting from the nodes 104A and 104B. As seen in FIG. 3, the nodes 104A and 104B may be input nodes to the circuit design 102. Specifically, the node 104A may be an input port that receives an enables signal for a receiver (rx_enable), and the node 104B may be an input port that receives a data signal for the receiver (rx_data). The system 100 traces paths from the nodes 104A and 104B to form the cone of influence 106A. The system 100 may have determined an intersection of the traced paths from the nodes 104A and 104B as the apex 108A of the cone of influence 106A. The system 100 may then compare the attributes 302A assigned to the nodes 104A and 104B with the attributes of the various safety mechanisms 112 in the catalog 110. In the example of FIG. 3, the system 100 determines that the attributes for the safety mechanism 112B match the attributes 302A for the nodes 104A and 104B. In response, the system 100 selects the safety mechanism 112B and places the safety mechanism 112B at the intersection or apex 108A of the cone of influence 106A.

The circuit designer may have instructed the system 100 to identify paths starting from the nodes 104C and 104D to form the cone of influence 106B, and in response, the system 100 traces paths starting from the nodes 104C and 104D. As seen in FIG. 3, the node 104C may be a signal internal to the circuit design as a data interrupt signal for a transmitter (tx_data_int), and the node 104D may be an internal enable signal for the transmitter (tx_enable). The system 100 may trace paths from the nodes 104C and 104D to form the cone of influence 106B. The system 100 may determine an intersection of these traced paths as the apex 108B of the cone of influence 106B. The system 100 then compares the attributes 302B of the nodes 104C and 104D with the attributes of the safety mechanisms 112 in the catalog 110. The system 100 may determine that the safety mechanism 112A has attributes that match the attributes 302B of the nodes 104C and 104D. In response, the system 100 selects the safety mechanism 112A and places the safety mechanism 112A at the apex 108B of the cone of influence 106B.

The circuit designer may instruct the system 100 to identify paths starting from the nodes 104E and 104F to form the cone of influence 106C, and in response, the system 100 traces paths starting from the nodes 104E and 104F. As seen in FIG. 3, the node 104E is an internal interrupt ready signal (int_ready), and the node 104F is an internal interrupt enable signal (int_enable). The system 100 traces paths from the nodes 104E and 104F to form the cone of influence 106C and determines an intersection of the traced paths as the apex 108C of the cone of influence 106C. The system 100 then compares the attributes 302C of the nodes 104E and 104F with the attributes of the safety mechanisms 112 in the catalog 110. The system 100 may determine that the safety mechanism 112E has attributes that match the attributes 302C of the nodes 104E and 104F. In response, the system 100 selects the safety mechanism 112E and places the safety mechanism 112E at the apex 108C of the cone of influence 106C.

The circuit designer may instruct the system 100 to identify paths starting from the nodes 104G and 104H to form the cone of influence 106D, and in response, the system 100 traces paths starting from the nodes 104G and 104H. As seen in FIG. 3, the node 104G is an input port for a read data signal for the register (reg_rd_data), and the node 104H is an internal read enable signal for a register (reg_rd_enable). The system 100 may trace paths from the nodes 104G and 104H to form the cone of influence 106D and determine an intersection of the traced paths as the apex 108D of the cone of influence 106D. The system 100 compares the attributes 302D of the nodes 104G and 104H with the attributes of the safety mechanisms 112 in the catalog 110. The system 100 may determine that the safety mechanism 112D has attributes that match the attributes 302D of the nodes 104G and 104H. In response, the system 100 selects the safety mechanism 112D and places the safety mechanism 112D at the apex 108D of the cone of influence 106D.

The circuit designer may instruct the system 100 to identify paths starting from the nodes 104I and 104J to form the cone of influence 106E, and in response, the system 100 traces paths starting from the nodes 104I and 104J. As seen in FIG. 3, the node 104I is an internal write enable signal for a register (reg_wr_enable), and the node 104J is an internal write data interrupt signal for the register (reg_wr_data_int). The system 100 traces paths from the nodes 104I and 104J to form the cone of influence 106E and determines an intersection of the traced paths as the apex 108E of the cone of influence 106E. The system 100 then compares the attributes 302E of the nodes 104I and 104J with the attributes of the safety mechanisms 112 in the catalog 110. The system 100 may determine that the attributes of the safety mechanism 112C match the attributes 302E of the nodes 104I and 104J. In response, the system 100 selects the safety mechanism 112C and places the safety mechanism 112C at the apex 108E of the cone of influence 106E.

The circuit designer may instruct the system 100 to identify paths starting from the nodes 104K and 104L to form the cone of influence 106F, and in response, the system 100 traces paths starting from the nodes 104K and 104L. As seen in FIG. 3, the node 104K is an output port for a data request signal (data_req), and the node 104L is an input port for a data acknowledgement signal (data_ack). The system 100 may trace paths from the nodes 104K and 104L to form the cone of influence 106F and determines that an intersection of the traced paths is the apex 108F of the cone of influence 106F. The system 100 compares the attributes 302F of the nodes 104K and 104L with the attributes of the safety mechanisms 112 in the catalog 110. The system 100 may determine that the attributes of the safety mechanism 112F match the attributes 302F of the nodes 104K and 104L. In response, the system 100 selects the safety mechanism 112F and places the safety mechanism 112F at the apex 108F of the cone of influence 106F.

Figure 4:
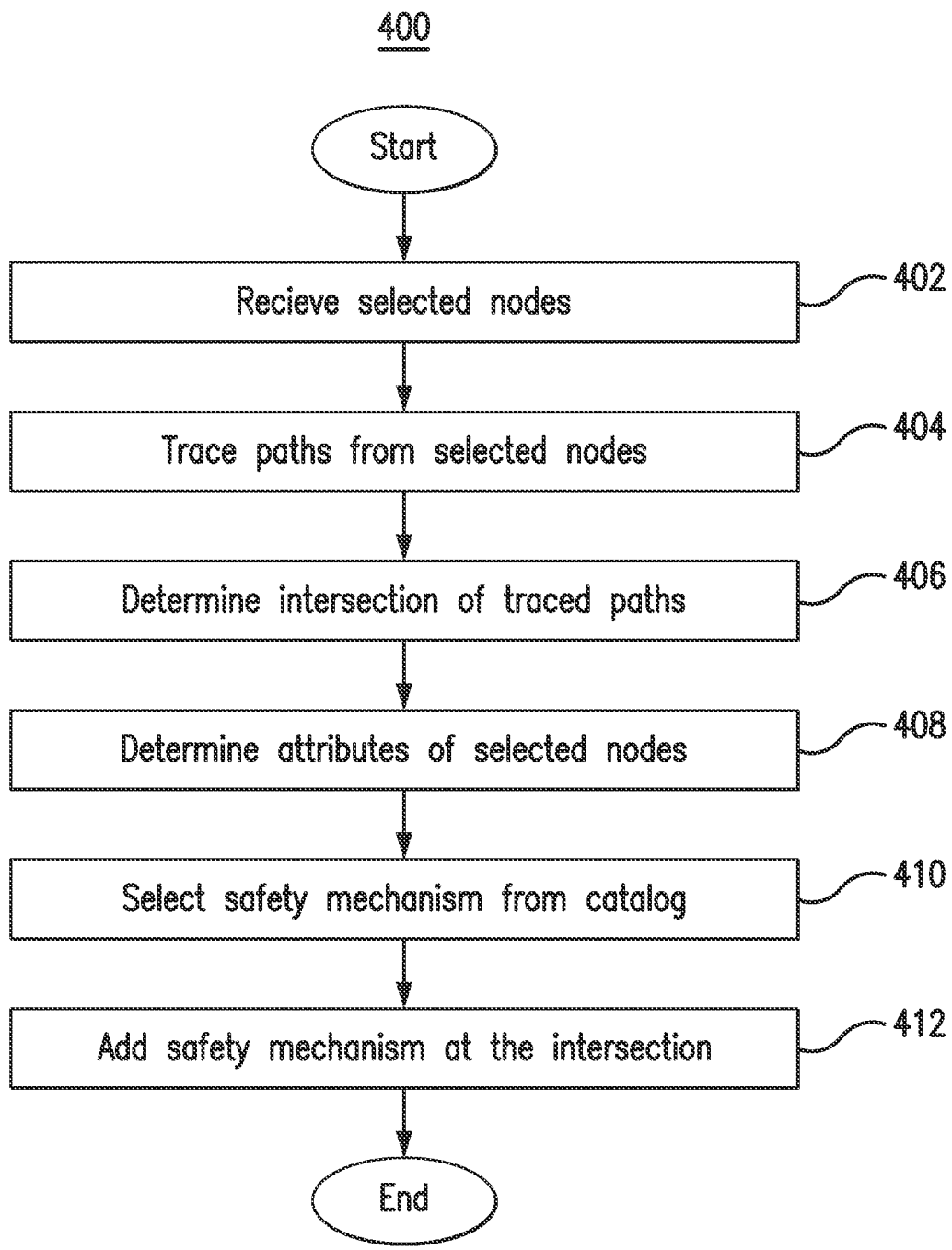
FIG. 4 is a flowchart of an example method for selecting and placing safety mechanisms into a circuit design performed in the system of FIG. 1.

FIG. 4 is a flowchart of an example method 400 for selecting and placing safety mechanisms into a circuit design performed in the system 100 of FIG. 1. In particular embodiments, a computer system (e.g., the computer system 800 shown in FIG. 8) performs the method 400. By performing the method 400, the computer system automatically selects and places safety mechanisms 112 into a circuit design 102.

In 402, the computer system receives selected nodes 104. The nodes 104 may represent any suitable circuit components or signals in the circuit design 102. A circuit designer may have selected these nodes 104 and instructed the computer system to trace paths from these selected nodes 104. The circuit designer may also have assigned attributes 302 to these selected nodes 104. The assigned attributes 302 may indicate the types of circuit components or signals included in the selected nodes 104.

In 404, the computer system identifies paths from the selected nodes 104 by tracing paths from the selected nodes 104. The path tracing can be in a forward or reverse direction. To trace the paths, the computer system may determine the flow of electric signals through the circuit design 102 starting from the selected nodes 104. These traced paths may reveal a cone of influence 106 of these selected nodes 104. The cone of influence 106 may indicate the circuit components or signals that are affected by changes to signals at the selected nodes 104.

In 406, the computer system determines an intersection of the traced paths from the selected nodes 104. The intersection may be a location in the circuit design 102 where the traced paths from the selected nodes 104 cross. In some embodiments, the computer system may designate this intersection as an apex 108 of the cone of influence 106.

In 408, the computer system determines the attributes 302 of the selected nodes 104. As discussed previously, the attributes 302 of the selected nodes 104 may have been assigned by the circuit designer. These attributes 302 may indicate the types of circuit components or signals included in the selected nodes 104.

In 410, the computer system selects a safety mechanism 112 from a catalog 110. The catalog 110 may include any suitable number of safety mechanisms 112. The catalog 110 may also identify attributes for each of the safety mechanisms 112. These attributes may have been assigned by a circuit designer or a designer of the catalog 110. The attributes for the safety mechanisms 112 may indicate the types of faults or errors detected by the safety mechanisms 112. In certain embodiments, the computer system selects from the catalog 110 the safety mechanisms 112 with attributes that match the attributes 302 of the selected nodes 104. In 412, the computer system adds the selected safety mechanism 112 to the circuit design 102 at the intersection of the traced paths from the selected nodes 104. For example, the computer system may place the selected safety mechanism 112 at the apex 108 of the cone of influence 106 for the selected nodes 104.

Figure 5:
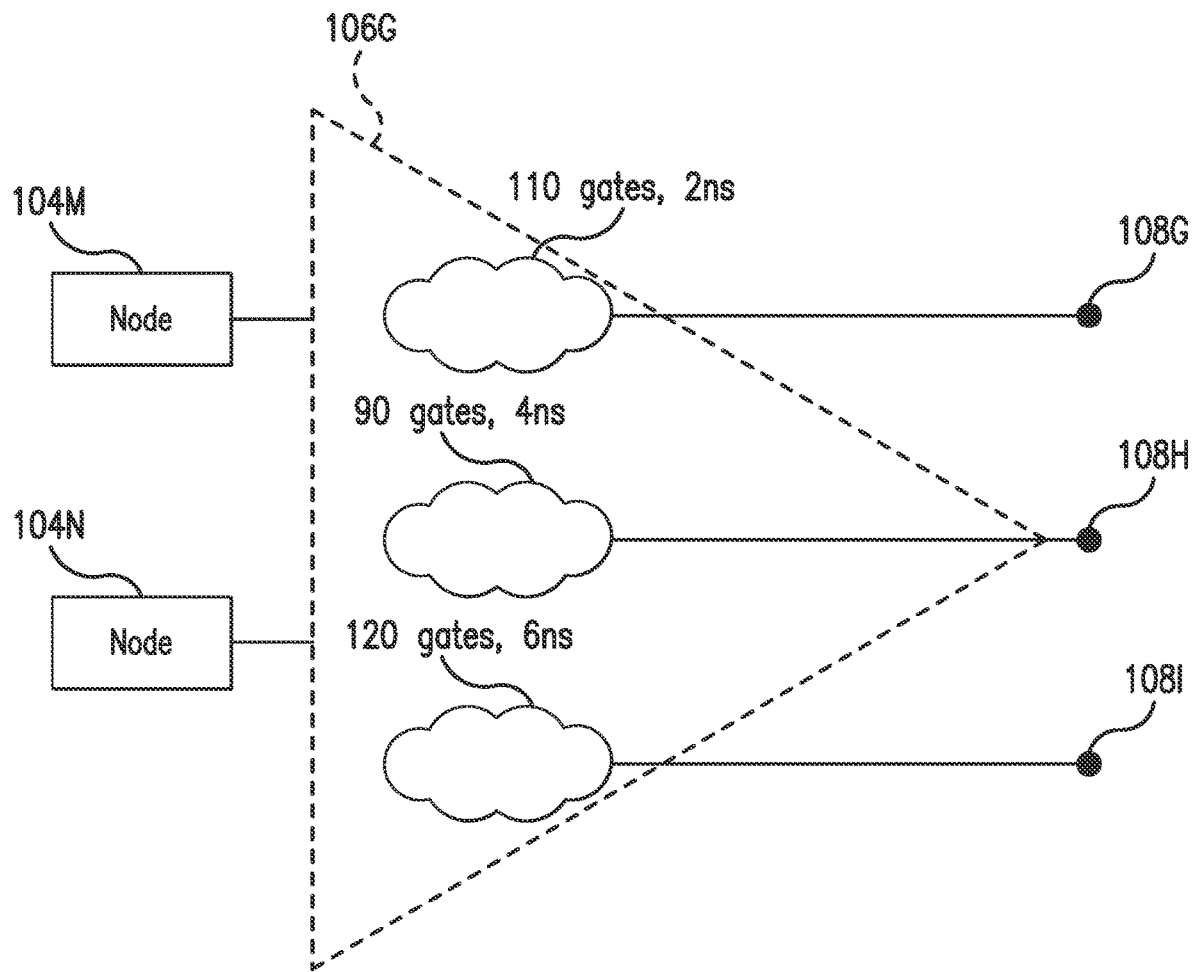
FIG. 5 illustrates an example apex selection in the system of FIG. 1.

FIG. 5 illustrates an example apex selection in the system 100 of FIG. 1. In some instances, paths from selected nodes 104 may branch within the circuit design 102. As a result, the system 100 may determine that the traced paths from the selected nodes 104 intersect at multiple intersection points. When there are multiple intersection points, the system 100 may perform additional analysis to determine where to place a selected safety mechanism 112. Generally, the system 100 may select an intersection point based on certain constraints (e.g., constraints provided by the circuit designer).

As seen in FIG. 5, the system 100 has traced paths from the selected nodes 104M and 104N to form the cone of influence 106G. The traced paths from the selected nodes 104M and 104N branch within the circuit design 102. As a result, the system 100 determines that the traced paths from the selected nodes 104M and 104N intersect at three different points. As a result, the system 100 determines three different apexes 108G, 108H, and 108I for the cone of influence 106G.

The system 100 may determine which of the apexes 108G, 108H, and 108I should be selected when placing a safety mechanism 112. For example, the system 100 may select an apex 108 based on certain constraints applied to the different traced paths. The example of FIG. 5 shows different examples in which an apex 108 is selected based on those constraints. As seen in FIG. 5, the traced paths that lead to the apex 108G include 110 gates and a two nanosecond timing path delay. The traced paths that lead to the apex 108H have 90 gates and a four nanosecond timing path delay. The traced paths that lead to the apex 108I have 120 gates and a six nanosecond timing path delay. The system 100 may select one of these apexes 108G, 108H, and 108I based on constraints on the gate counts or timing.

In the first example, the circuit designer provided the constraint that the area for the selected apex 108 should have less than 115 gates. In response, the system 100 may review the traced paths and determine that the traced paths that lead to the apexes 108G and 108H include less than 115 gates. The system 100 may select the apex 108H, because the traced paths that lead to the apex 108H have the fewest number of gates that is within the 115 gate constraint.

In a second example, the circuit designer provided the constraint that the timing of path delay be less than the five nanoseconds. The system 100 may review the timings of the traced paths from the selected nodes 104M and 104N and determine that the traced paths that lead to the apexes 108G and 108H have timings less than five nanoseconds. The system 100 may select the apex 108G, because the traced paths that lead to the apex 108G have the lowest timing that within the five nanosecond timing constraint.

In the third example, the circuit designer provided the constraints that the area be less than 115 gates and that the timing be less than three nanoseconds. The system 100 may review the traced paths from the selected nodes 104M and 104N and determine that the traced paths that lead to the apex 108G have less than 115 gates and a timing less than three nanoseconds. In response, the system 100 may select the apex 108G.

After the system 100 selects the apex 108 based on the provided constraints, the system 100 may add selected safety mechanisms 112 to the selected apex 108. In this manner, the system 100 selects an apex 108 when there are multiple apexes 108 available for the placement of the safety mechanisms 112.

In certain embodiments, when multiple apexes 108 equally satisfy the provided constraints, the system 100 may select any of the apexes for the placement of the safety mechanisms 112. For example, the system 100 may randomly select one of the apexes 108 for the placement of safety mechanisms 112. In some instances, the system 100 may ask the circuit designer to select from the apexes 108 that equally satisfy the constraints.

Figure 6:
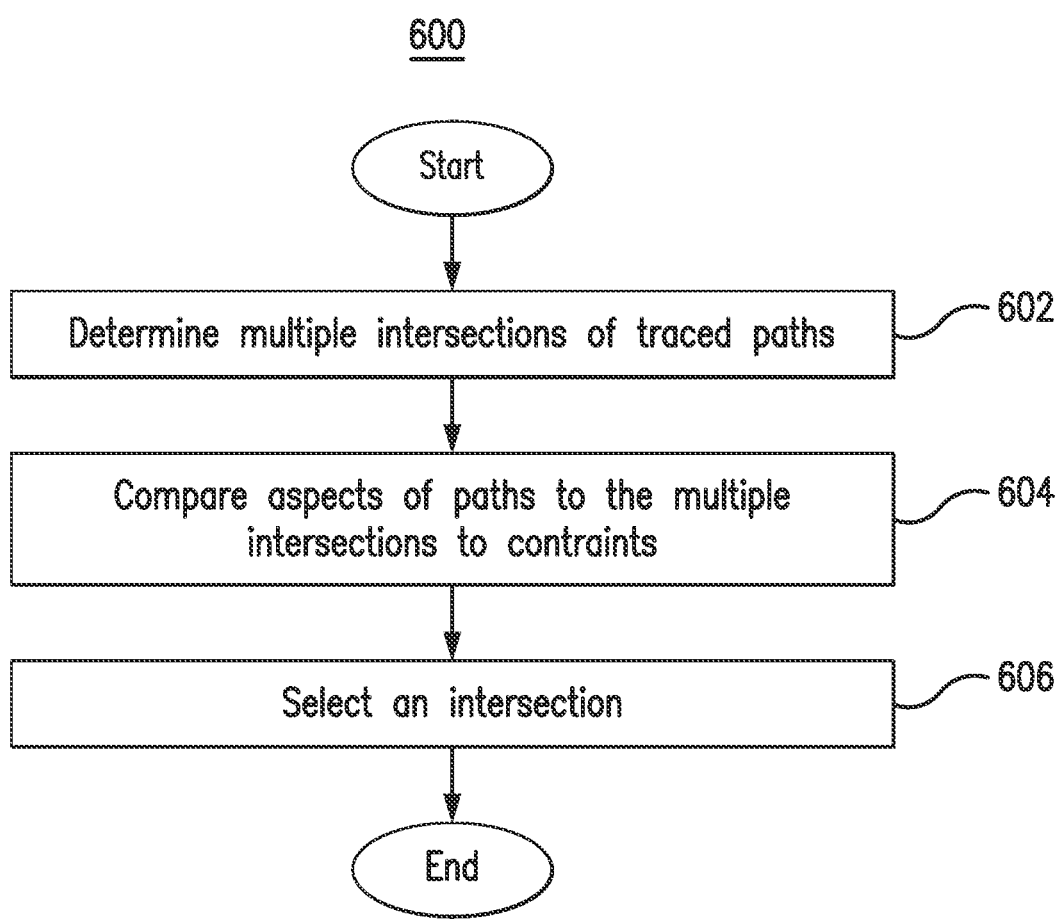
FIG. 6 is a flowchart of an example method for selecting an apex or intersection performed in the system of FIG. 1.

FIG. 6 is a flowchart of an example method 600 for selecting an apex or intersection performed in the system 100 of FIG. 1. In particular embodiments, a computer system (e.g., the computer system 800 of FIG. 8) performs the method 600. By performing the method 600, the computer system selects an apex 108 based on provided constraints.

In 602, the computer system determines multiple intersections of traced paths from selected nodes 104. The computer system may receive selected nodes 104 from a circuit designer. The computer system may then trace paths from the selected nodes 104. The traced paths may branch in the circuit design and intersect at multiple places. The computer system may determine these multiple intersections of the traced paths.

In 604, the computer system compares aspects of the traced paths to certain constraints. These constraints may have been provided by the circuit designer, and the constraints may relate to any suitable aspect or feature of the circuit design 102. For example, the constraints may relate to the area or a number of gates. As another example, the constraints may relate to a timing. The computer system compares the aspects of the traced paths to the provided constraints to see which of the traced paths satisfy the constraints. For example, the computer system may evaluate which of the paths have an area or a timing that satisfies the provided constraints. The computer system may then determine the apexes 108 of the traced paths that satisfy the provided constraints.

In 606, the computer system selects an intersection or apex 108 of paths that satisfy the provided constraints. For example, if the provided constraint is that the traced paths include a certain number of gates, then the computer system may select the intersection or apex 108 of the traced paths that include a number of the gates that is within the constraint. In some embodiments, when multiple paths equally satisfy a provided constraint, the computer system selects an intersection or apex 108 at random, or the computer system may request the circuit designer to select an intersection or apex 108.

Figure 7:
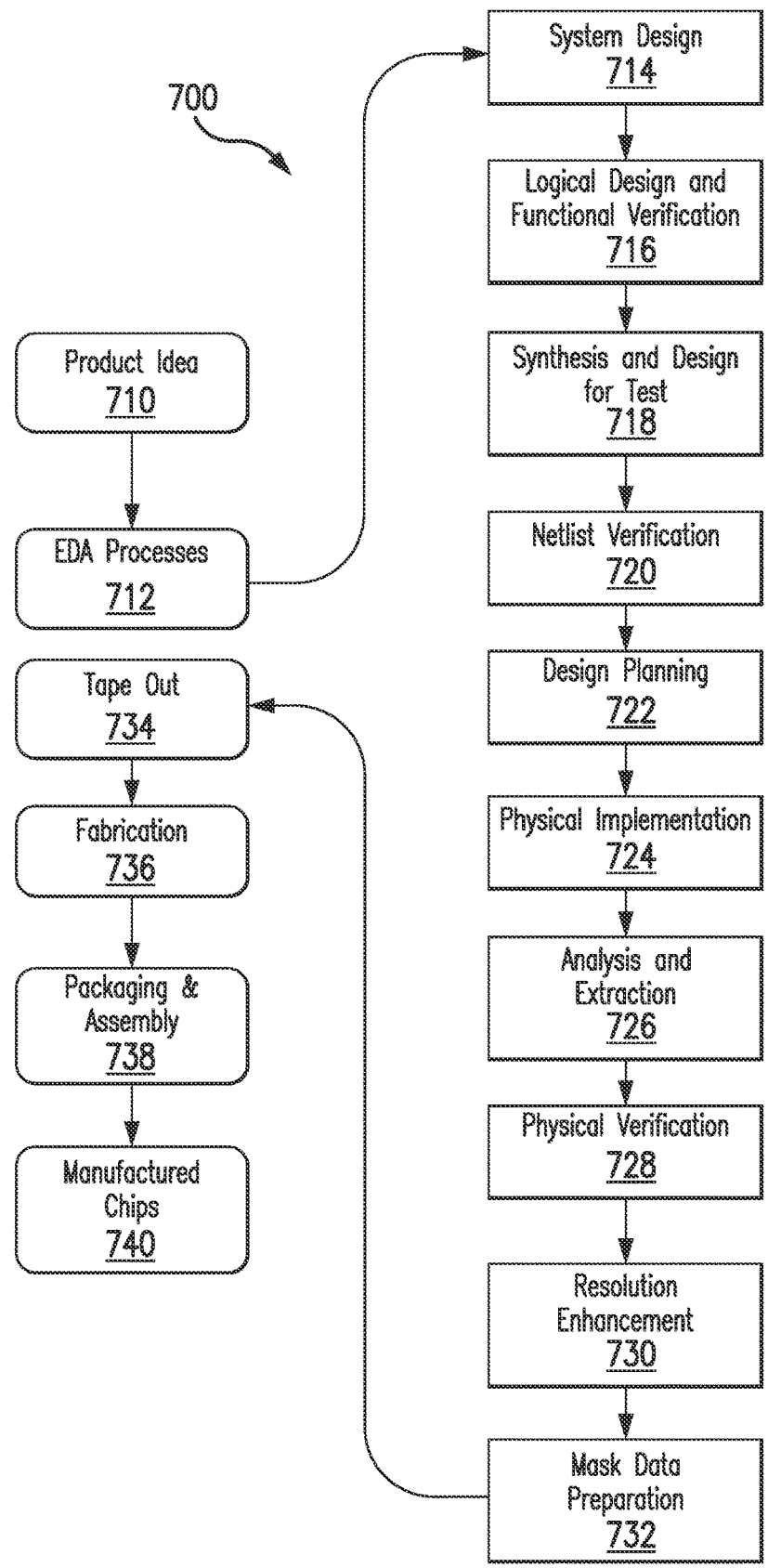
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
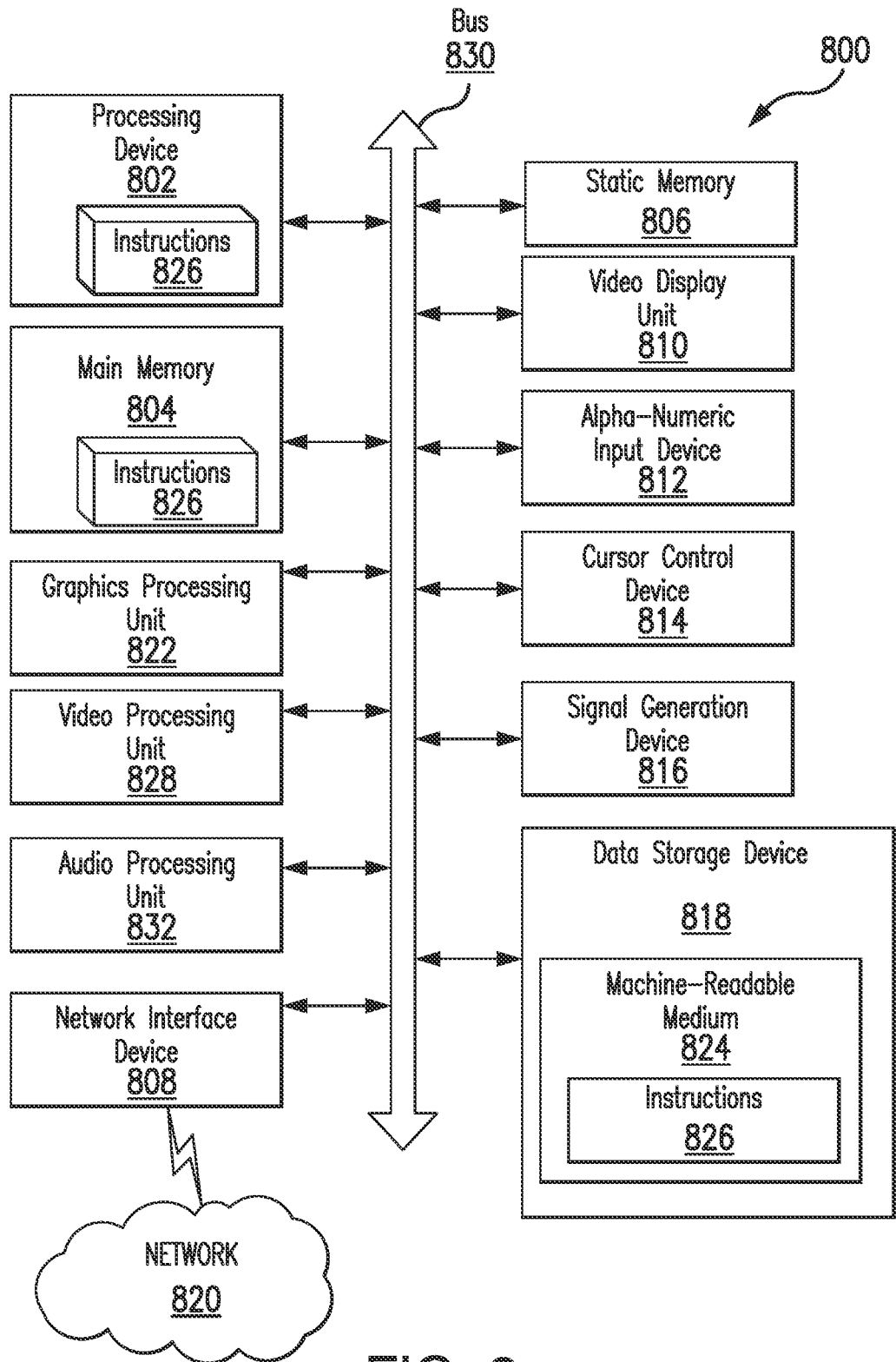
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of designing a circuit, the method comprising:
   identifying a first path from a first selected node of a circuit design, wherein a first attribute is assigned to the first selected node;
   identifying a second path from a second selected node of the circuit design, wherein a second attribute is assigned to the second selected node;
   determining a first intersection of the first path and the second path;
   selecting, by a processing device, a safety mechanism from a plurality of safety mechanisms based at least in part on the first attribute and the second attribute; and
   adding the safety mechanism to the circuit design at the first intersection.

2. The method of claim 1, wherein a third attribute is assigned to the safety mechanism, and wherein selecting the safety mechanism is based at least in part on the third attribute matching at least one of the first attribute and the second attribute.

3. The method of claim 2, wherein the third attribute comprises a diagnostic coverage percentage of the safety mechanism.

4. The method of claim 2, wherein the third attribute comprises an indication of whether the safety mechanism is used on an encoder datapath or a decoder datapath.

5. The method of claim 1, further comprising determining a second intersection of the first path and the second path, wherein adding the safety mechanism at the first intersection is based at least in part on a comparison of one or more of an area and a timing of the circuit design to the first intersection to one or more of an area and a timing of the circuit design to the second intersection.

6. The method of claim 1, wherein the first selected node is a pin, a wire, a flop, or a signal in the circuit design.

7. The method of claim 1, wherein identifying the first path and the second path produces a cone of influence, and wherein the first intersection is an apex of the cone of influence.

8. A system for designing a circuit, the system comprising:
   a memory; and
   a processor communicatively coupled to the memory, the processor configured to:
     trace a first path from a first selected node of a circuit design, wherein a first attribute is assigned to the first selected node;
     trace a second path from a second selected node of the circuit design, wherein a second attribute is assigned to the second selected node;
     determine a first intersection of the first path and the second path;
     select a safety mechanism from a catalog of safety mechanisms based at least in part on the first attribute and the second attribute; and
     add the safety mechanism to the circuit design at the first intersection.

9. The system of claim 8, wherein a third attribute is assigned to the safety mechanism in the catalog, and wherein selecting the safety mechanism is based at least in part on the third attribute matching at least one of the first attribute and the second attribute.

10. The system of claim 9, wherein the third attribute comprises a diagnostic coverage percentage of the safety mechanism.

11. The system of claim 9, wherein the third attribute comprises an indication of whether the safety mechanism is used on an encoder datapath or a decoder datapath.

12. The system of claim 8, wherein the processor is further configured to determine a second intersection of the first path and the second path, wherein adding the safety mechanism at the first intersection is based at least in part on a comparison of one or more of an area and a timing of the circuit design to the first intersection to one or more of an area and a timing of the circuit design to the second intersection.

13. The system of claim 8, wherein the first selected node is a pin, a wire, a flop, or a signal in the circuit design.

14. The system of claim 8, wherein tracing the first path and the second path produces a cone of influence, and wherein the first intersection is an apex of the cone of influence.

15. A non-transitory, computer readable medium storing instructions that, when executed by a processor, cause the processor to perform an operation for designing a circuit, the operation comprising:
    tracing a first path from a first node of a circuit design and a second path from a second node of the circuit design to produce a cone of influence, wherein a first attribute is assigned to the first node, and wherein a second attribute is assigned to the second node;
    determining a first apex of the cone of influence;
    selecting a safety mechanism from a catalog of safety mechanisms based at least in part on the first attribute and the second attribute; and
    adding the safety mechanism to the circuit design at the first apex of the cone of influence.

16. The medium of claim 15, wherein a third attribute is assigned to the safety mechanism in the catalog, and wherein selecting the safety mechanism is based at least in part on the third attribute matching at least one of the first attribute and the second attribute.

17. The medium of claim 16, wherein the third attribute comprises a diagnostic coverage percentage of the safety mechanism.

18. The medium of claim 16, wherein the third attribute comprises an indication of whether the safety mechanism is used on an encoder datapath or a decoder datapath.

19. The medium of claim 15, wherein the operation further comprises determining a second apex of the cone of influence, wherein adding the safety mechanism at the first apex is based at least in part on a comparison of one or more of an area and a timing of the circuit design to the first apex to one or more of an area and a timing of the circuit design to the second apex.

20. The medium of claim 15, wherein the first node is a pin, a wire, a flop, or a signal in the circuit design.

* * * * *